US005723983A

United States Patent [19]

Matsuno

[11] Patent Number: 5,723,983
[45] Date of Patent: Mar. 3, 1998

[54] METHOD OF EVALUATING SEMICONDUCTOR DEVICE WITHOUT ELECTRICAL INFLUENCE OF PARASITIC ELEMENTS

[75] Inventor: Noriaki Matsuno, Tokyo, Japan

[73] Assignee: NEC Corporation, Tokyo, Japan

[21] Appl. No.: 698,158

[22] Filed: Aug. 7, 1996

[30] Foreign Application Priority Data

Aug. 11, 1995 [JP] Japan ................................ 7-227090

[51] Int. Cl.$^6$ ................................................ G01R 31/26
[52] U.S. Cl. ........................................................... 324/769
[58] Field of Search ........................ 324/769, 765–768, 324/719; 437/8; 257/48

[56] References Cited

U.S. PATENT DOCUMENTS

| | | | |
|---|---|---|---|
| 4,894,612 | 1/1990 | Drake et al. | 324/754 |
| 5,396,184 | 3/1995 | Frank et al. | 324/713 |

OTHER PUBLICATIONS

S. Lee et al., "New Circuit Model for RF Probe Pads and Interconnections for the Extraction of HBT Equivalent Circuits," *IEEE Electron Device Letters*, vol. 12, No. 10, Oct. 1991, pp. 521–523.

*Primary Examiner*—Ernest F. Karlsen
*Assistant Examiner*—Anh Phung
*Attorney, Agent, or Firm*—Sughrue, Mion, Zinn, Macpeak & Seas, PLLC

[57] ABSTRACT

A circuit component such as a field effect transistor in a semiconductor device is evaluated without an influence of parasitic components by comparing a set of y-parameters or a set of z-parameters of the circuit component with a set of y-parameters or a set of z-parameters of a first comparative sample equivalent to the semiconductor device without the circuit component and a set of y-parameters or a set of z-parameters of a second comparative sample equivalent to the semiconductor device with the circuit component short-circuited, and the sets of y-parameters or z-parameters are obtained from sets of four-terminal parameters measured under the same conditions.

8 Claims, 15 Drawing Sheets

1

METHOD OF EVALUATING SEMICONDUCTOR DEVICE WITHOUT ELECTRICAL INFLUENCE OF PARASITIC ELEMENTS

FIELD OF THE INVENTION

This invention relates to a method of evaluating a semiconductor device and, more particularly, to a method of exactly evaluating a semiconductor device without electrical influences of parasitic elements such as probe pads, a jig and a package on the result data.

DESCRIPTION OF THE RELATED ART

A semiconductor device includes circuit components such as a field effect transistor and a bipolar transistor, and these circuit components are fabricated through a complex process sequence. The manufacturer wants to know whether the complex process sequence is appropriately controlled, and evaluates the semiconductor device after the fabrication.

A typical example of the evaluation method is to analyze four terminal parameters. The four terminal parameters are measured as follows. Pads are previously formed on a semiconductor device for an on-wafer probing, and four probes are brought into contact with the pads so as to electrically connect a testing apparatus to the circuit component. The testing apparatus supplies a testing signal through the pads to the field effect transistors FET1, and electrically checks the circuit component. An output signal returns from the circuit component to the testing apparatus, and the testing apparatus determines the four terminal parameters. The semiconductor device may be mounted on a jig or a package.

FIG. 1 illustrates an equivalent circuit of a semiconductor device provided with pads for the on-wafer probing. A field effect transistor FET1 is incorporated in the semiconductor device, and is subjected to the evaluation. When the pads for the on-wafer probing are provided for the field effect transistor FET1, parasitic resistances Rpg, Rpd and Rps and parasitic inductances Lpg, Lpd and Lps are coupled to the gate electrode G, the drain node D and the source node S of the field effect transistor FET1, and parasitic capacitances CPgd, Cpgs and Cpds are coupled therebetween.

When a semiconductor device is mounted on a jig or a package, parasitic resistances Rpg, Rpd and Rps, parasitic inductances Lpg, Lpd and Lps and parasitic capacitances Cpgd, Cpgs and Cpds are coupled to a field effect transistor FET2 incorporated in the semiconductor device as shown in FIG. 2.

For this reason, the parasitic resistances Rpg, Rpd and Rps, the parasitic inductances Lpg, Lpd and Lps and the parasitic capacitances Cpgd, Cpgs and Cpds affect the four terminal parameters.

When the testing signal exceeds over 1 GHz, the parasitic components Rpg/Rpd/Rps, Lpg/Lpd/Lps and Cpgd/Cpgs/Cpds have large influences on the output signal, and the four terminal parameters are not reliable.

In order to keep the reliability of the four terminal parameters, the manufacturer directly measures the parasitic components Rpg/Rpd/Rps, Lpg/Lpd/Lps and Cpgd/Cpgs/Cpds, and takes the measured values into account so as to eliminate the influence of the parasitic components Rpg/Rpd/Rps, Lpg/Lpd/Lps and Cpgd/Cpgs/Cpds from the four terminal parameters. However, the parasitic components Rpg/Rpd/Rps, Lpg/Lpd/Lps and Cpgd/Cpgs/Cpds are usually measured at a low frequency much less than 1 GHz.

2

When the frequency is high, the parasitic resistors Rpg, Rpd and Rps have frequency dependency due to the skin effect. The parasitic capacitances Cpg, Cpd and Cps are usually so small that the measured values are not reliable. For this reason, even though the measured values are taken into account, the four terminal parameters are still low in reliability.

The parasitic components of the pads, the jig or the package are extractable by using an equivalent circuit parameter extraction technique. A curve fitting, which uses the least square method, is available for the extraction of the parasitic components of the pads, the jig or the package, and is expected to eliminate the influences of these parasitic components from the four terminal parameters. However, the fitting work consumes a large amount of time and labor, and the modified four terminal parameters are less reliable.

Although the description is made on the assumption that the field effect transistor FET1/FET2 is subjected to the test, a test for a bipolar transistor or another circuit component also encounters the problem in reliability.

SUMMARY OF THE INVENTION

It is therefore an important object of the present invention to provide a method of evaluating a semiconductor device which eliminates influences of parasitic components from a result of the evaluation.

To accomplish the object, the present invention proposes to eliminate influences of parasitic components from four terminal parameters for a circuit component fabricated on a semiconductor substrate by using first and second comparative samples equivalent to the semiconductor substrate except for the circuit component.

In accordance with the present invention, there is provided a method of evaluating a semiconductor device, comprising the steps of: a) preparing a semiconductor device having at least one circuit component, a first comparative sample equivalent to the semiconductor device from which the at least one circuit component is deleted and a second comparative sample equivalent to the semiconductor device in which the at least one circuit component is short-circuited; b) respectively measuring a first set of four terminal parameters, a second set of four terminal parameters and a third set of four terminal parameters for the semiconductor device, the first comparative sample and the second comparative sample connected through a coupling means to a testing apparatus; c) obtaining a first set of y-parameters or a first set of z-parameters, a second set of y-parameters or a second set of z-parameters and a third set of y-parameters or a third set of z-parameters from the first set of four terminal parameters, the second set of four terminal parameters and the third set of four terminal parameters; d) calculating a fourth set of y-parameters or a fourth set of z-parameters for the at least one circuit component on the basis of the first to third sets of z-parameters or the first to third sets of y-parameters; and e) determining electric characteristics of the at least one circuit component on the basis of the fourth set of y-parameters or the fourth set of z-parameters.

BRIEF DESCRIPTION OF THE DRAWINGS

The features and advantages of the method of evaluating a semiconductor device according to the present invention will be more clearly understood from the following description taken in conjunction with the accompanying drawings in which.

PRINCIPLE OF THE INVENTION

Figure 1:
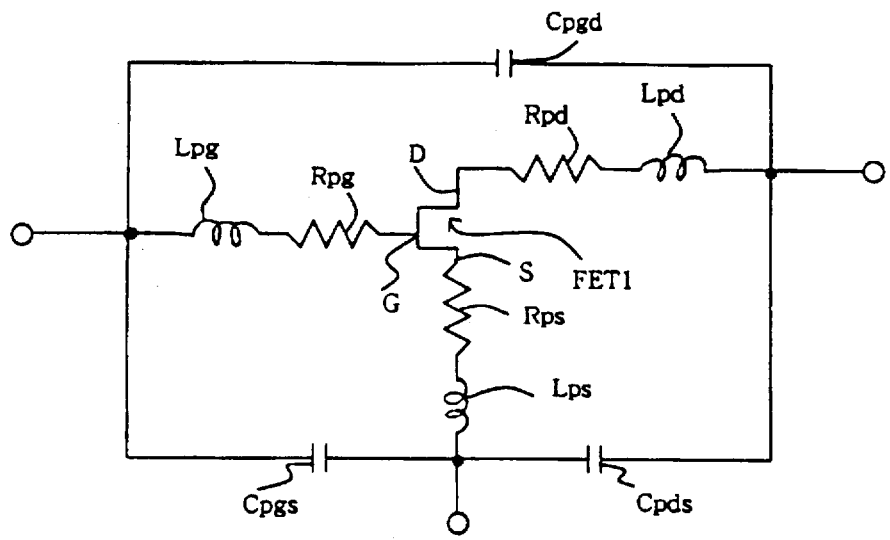
FIG. 1 is a circuit diagram showing the equivalent circuit of the semiconductor device with the pads for the on-wafer probing.
Figure 2:
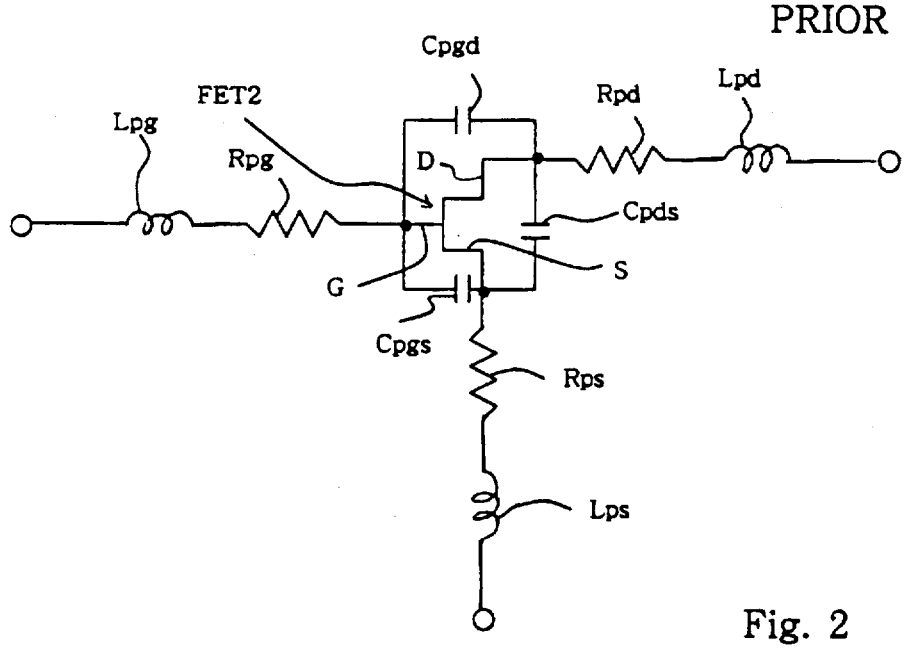
FIG. 2 is a circuit diagram showing the equivalent circuit of the semiconductor device mounted on the jig or the package.
Figure 3:
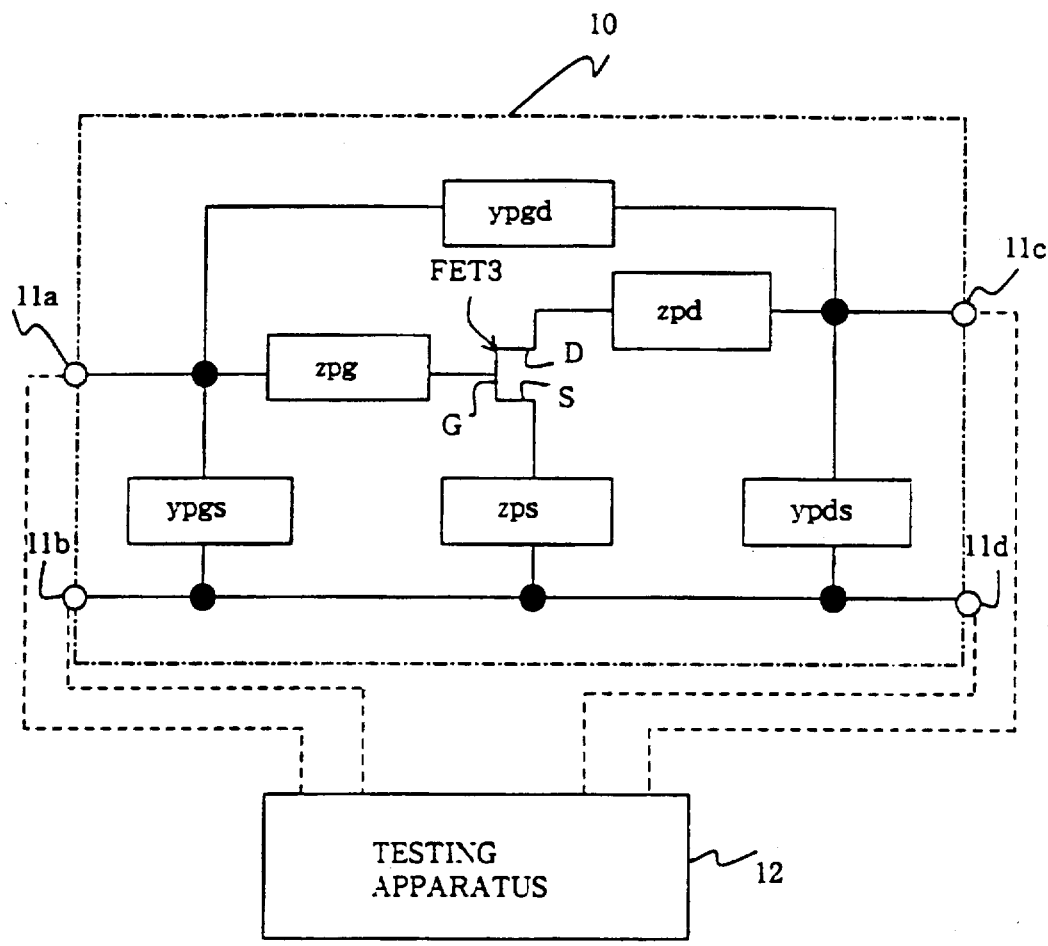
FIG. 3 is a circuit diagram showing an equivalent circuit of a semiconductor device subjected to an evaluation according to the present invention.

Referring to FIG. 3 of the drawings, a field effect transistor FET3 is incorporated in a semiconductor device 10, and pads for an on-wafer probing are formed on the semiconductor device 10. The gate electrode G, the drain node D and the source node S of the field effect transistor FET3 are connected to the pads, and the pads are represented by four terminals 11a, 11b, 11c and 11d in an equivalent circuit shown in FIG. 3. A testing apparatus 12 is connected to the pads, and a microprocessor (not shown) is incorporated in the testing apparatus 12 for a data processing.

Parasitic components due to the pads are coupled to the gate electrode G, the drain node D and the source node S, and are represented by zpg, zpd, zps and ypgd, ypgs, ypds in the equivalent circuit.

Figure 4:
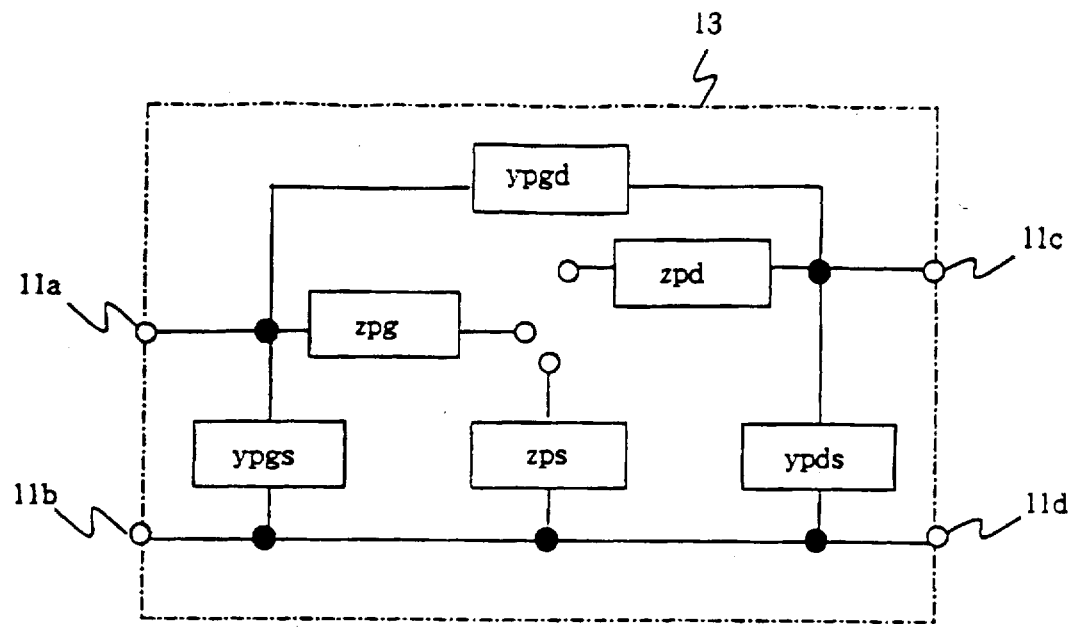
FIG. 4 is a circuit diagram showing an equivalent circuit of a first comparative sample used in the evaluation.
Figure 5:
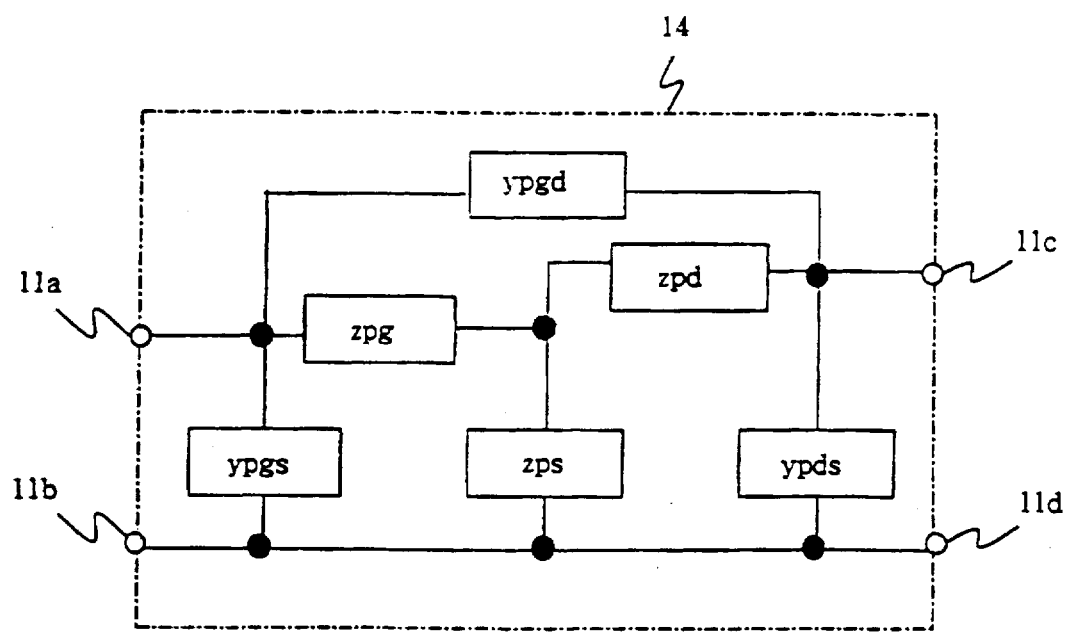
FIG. 5 is a circuit diagram showing an equivalent circuit of a second comparative sample used in the evaluation.

A first comparative sample 13 and a second comparative sample 14 are prepared for the evaluation according to the present invention, and are illustrated in FIGS. 4 and 5, respectively.

The field effect transistor FET3 is eliminated from the semiconductor device shown in FIG. 4; however, the pads are also formed on the first comparative sample 13. For this reason, only the parasitic components zpg, zpd, zps and ypgd, ypgs, ypds are left in the first comparative sample as similar to the semiconductor device 10.

On the other hand, the gate electrode G and the source and drain nodes S and D are short circuited in the second comparative sample 14. The pads are also formed on the second comparative sample 14, and the parasitic components zpg, zpd, zps and ypgd, ypgs, ypds are left in the second comparative sample 14.

A set Yb of y-parameters (yb11, yb12, yb21, yb22) of the circuit network shown in FIG. 4 is expressed by the following equations.

| | |
|---|---|
| $yb11 = ypgs$ | equation 1 |
| $yb12 = -ypgd$ | equation 2 |
| $yb21 = -ypgd$ | equation 3 |
| $yb22 = ypds$ | equation 4 |

Figure 6:
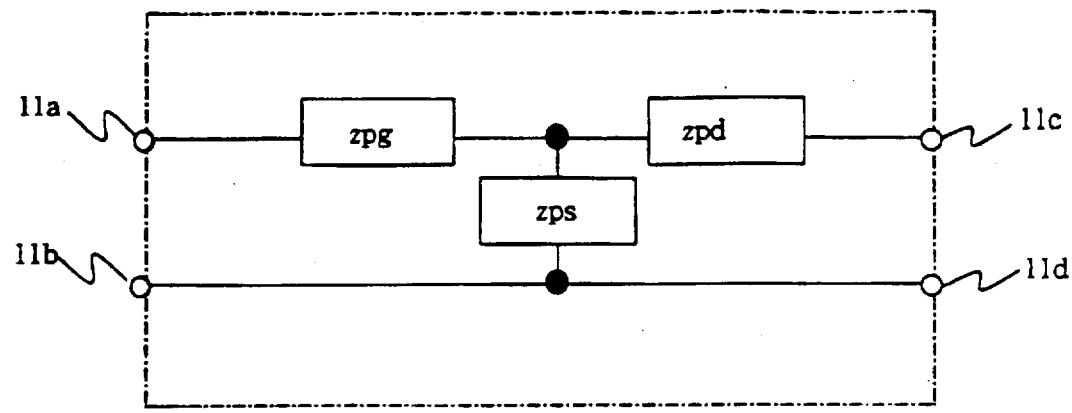
FIG. 6 is a circuit diagram showing a circuit network used in an analysis for a principle of the present invention.

Taking the circuit network shown in FIG. 6 into account, a set Zd of z-parameters (zd11, zd12, zd21, zd22) of the circuit network is expressed by the following equations.

| | |
|---|---|
| $zd11 = zpg + zps$ | eqation 5 |
| $zd12 = zps$ | equation 6 |
| $zd21 = zps$ | equation 7 |
| $zd22 = zpd + zps$ | equation 8 |

Figure 7:
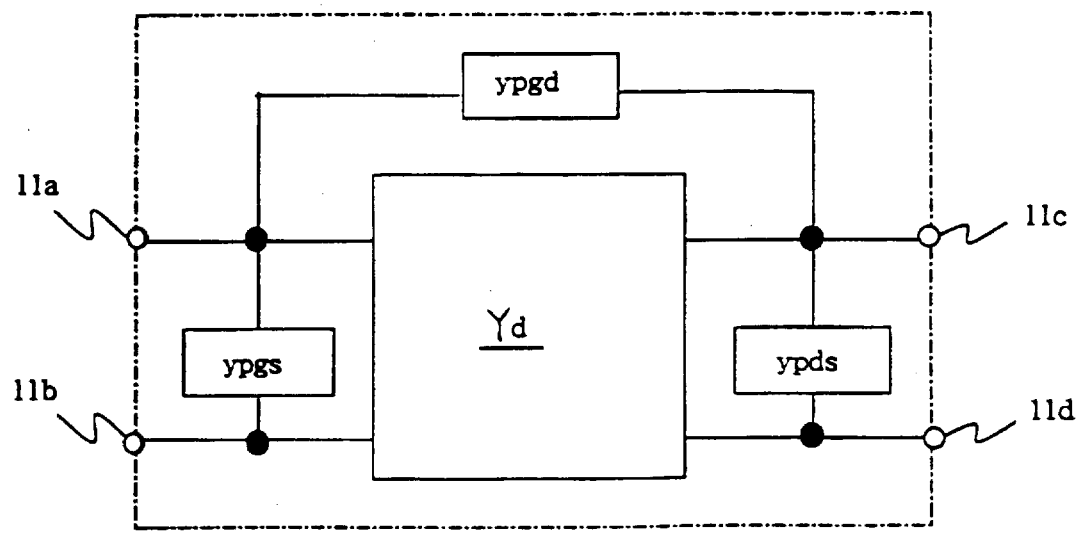
FIG. 7 is a circuit diagram showing another circuit network used in the analysis.

The set of z-parameters (zd11, zd12, zd21, zd22) is converted to a set Yd of y-parameters (yd11, yd12, yd21, yd22). A circuit network shown in FIG. 7 is equivalent to the circuit network shown in FIG. 5, and a set Yc of y-parameters (yc11, yc12, yc21, yc22) is given to the circuit network shown in FIG. 7 as follows.

| | |
|---|---|
| $yc11 = ypgs + yd11 = yb + yd11$ | equation 9 |
| $yc12 = -ypgd + yd12 = yb12 + yd12$ | equation 10 |
| $yc21 = -ypgd + yd13 = yb21 + yd13$ | equation 11 |
| $yc22 = ypds + yd14 = yb22 + yd14$ | equation 12 |

From equations 9 to 12, we obtain equation 13.

| | |
|---|---|
| $Yc = Yb + Yd$ | equation 13 |

Figure 8:
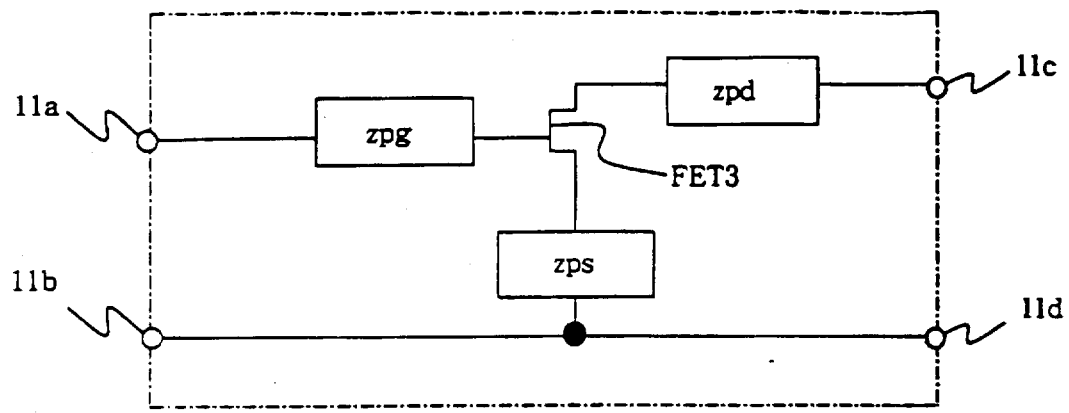
FIG. 8 is a circuit diagram showing yet another circuit network used in the analysis.

Considering a circuit network shown in FIG. 8, a set Ze of z-parameters (ze11, ze12, ze21, ze22) are expressed by equations 14 to 17.

| | |
|---|---|
| $ze11 = zpg + zps + zi11 = zd11 + zi11$ | equation 14 |
| $ze12 = zps + zi12 = zd12 + zi12$ | equation 15 |

$$ze21 = zps + zi21 = zd21 + zi21 \qquad \text{equation 16}$$

$$ze22 = zpd + zps + zi22 = zd22 + zi22 \qquad \text{equation 17}$$

where zi11, zi12, zi21 and zi22 are a set Zi of z-parameters of the field effect transistor FET3.

From equations 14 to 17, we obtain the following equation.

$$Ze = Zd + Zi \qquad \text{equation 18}$$

The set Ze of z-parameters is converted to a set of y-parameters, and the set of y-parameters is labeled with "Ye".

Figure 9:
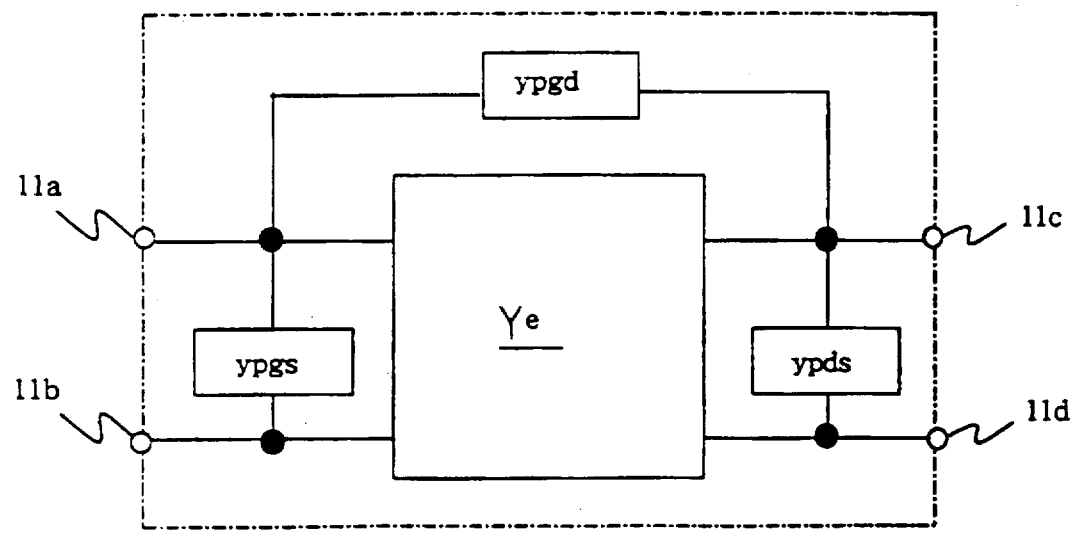
FIG. 9 is a circuit diagram showing still another circuit network used in the analysis.

Subsequently, let us consider a circuit network shown in FIG. 9. The circuit network shown in FIG. 9 is equivalent to the equivalent circuit shown in FIG. 3, and a set Ya of y-parameters are given by equations 19 to 22. From equations 19 to 22, we obtain equation 23.

$$Ya = Yb + Ye \qquad \text{equation 23}$$

The matrix of y-parameters and the matrix of z-parameters are the inverse matrix to each other, and equation 24 is led from equations 13, 18 and 23.

$$\begin{aligned} Ya &= Yb + Ye \\ &= Yb + inv(Ze) \\ &= Yb + inv(Zd + Zi) \\ &= Yb + inv(inv(Yc - Yb) + Zi) \end{aligned} \qquad \text{equation 24}$$

Solve equation 24 for Zi. We obtain equation 25.

$$Zi = inv(Ya - Yb) - inv(Yc - Yb) \qquad \text{equation 25}$$

Equation 25 teaches that the set Zi of z-parameters of the field effect transistor FET3 is calculated from the set Ya of y-parameters for the semiconductor device 10 and the sets Yb, Yc of y-parameters for the first and second comparative samples 13 and 14.

In the actual evaluation, the four terminal parameters are measured for the semiconductor device 10 and the first and second comparative samples 13 and 14. Then, the three sets of four terminal parameters are converted to the sets Ya, Yb, Yc of y-parameters, and the set Zi of z-parameters is calculated by using equation 25 for the field effect transistor FET3. The set Zi of z-parameters does not contain a noise due to the parasitic components, and is representative of the transistor characteristics of the field effect transistor FET3. The set Zi of z-parameters may be converted to a set of four terminal parameters representative of the transistor characteristics of the field effect transistor FET3. The manufacturer exactly evaluates the field effect transistor FET3 on the basis of the set Zi of z-parameters or the set of four terminal parameters. Moreover, the calculation is only the conversion between the different kinds of parameters, and is simpler than the fitting. For this reason, the evaluation is economical.

In this instance, a coupling means is implemented by the pads formed on the semiconductor device 10, the pads formed on the first comparative sample and the pads formed on the second comparative sample.

Figure 10:
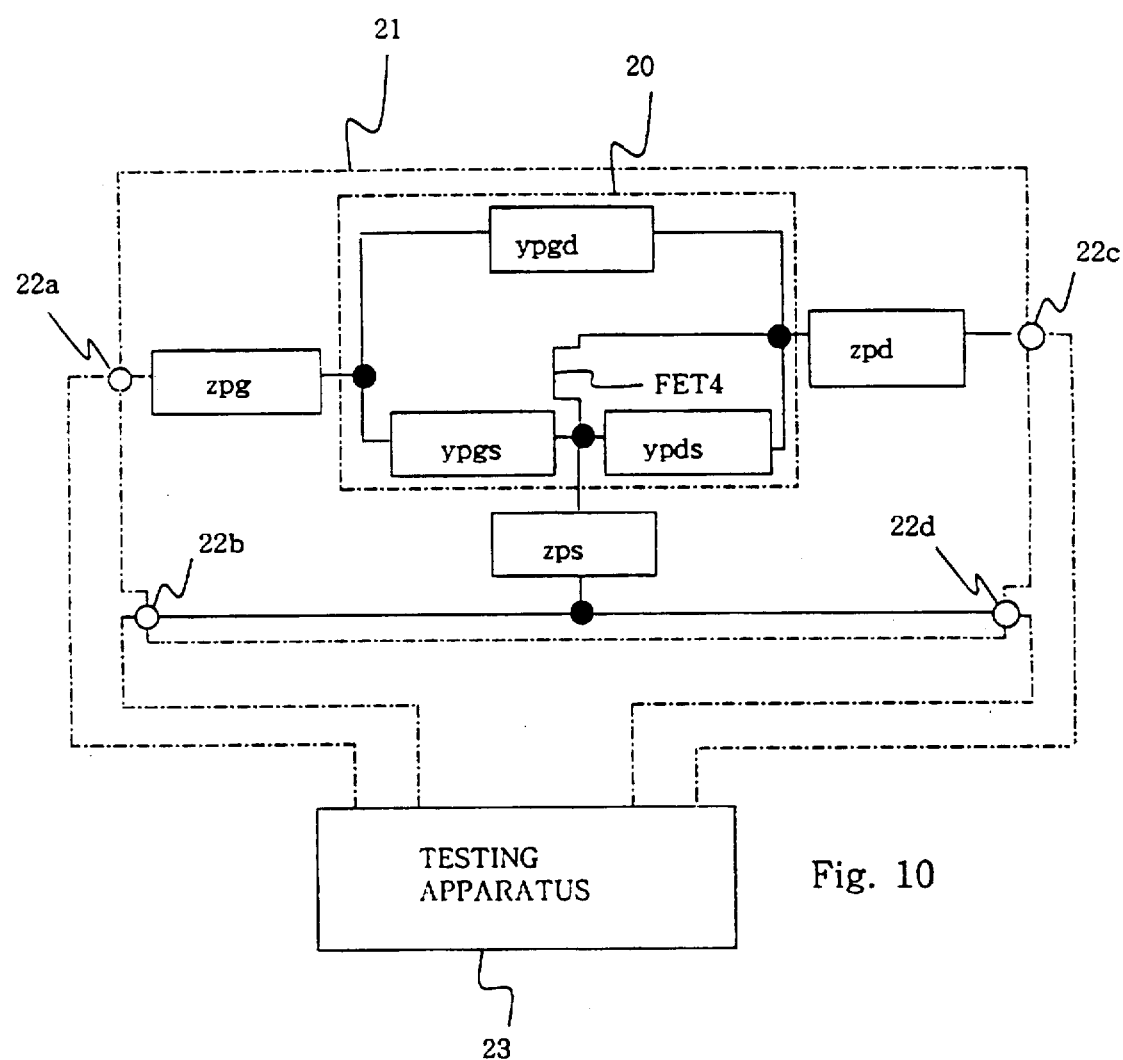
FIG. 10 is a circuit diagram showing an equivalent circuit for a semiconductor device mounted on a jig.

When a semiconductor device 20 is mounted on a jig 21, the semiconductor device 20 and the jig 21 are equivalent to a circuit configuration shown in FIG. 10. The jig 21 has ports represented by four terminals 22a, 22b, 22c and 22d, and a testing apparatus 23 is connected to the four terminals 22a to 22d. A field effect transistor FET4 is incorporated in the semiconductor device 20, and parasitic components ypgd, ypgs, ypds, zpg, zpd and zps are coupled to the field effect transistor FET4.

A first comparative sample 24 and a second comparative sample 25 are prepared. The first comparative sample 24 and the second comparative sample 25 are similar to the semiconductor device 20 except for the field effect transistor FET4. Namely, the field effect transistor FET4 is removed from the first comparative sample 24 (see FIG. 11), and the gate electrode G, the drain node D and the source node S are short circuited in the second comparative sample 25 (see FIG. 12).

Figure 12:
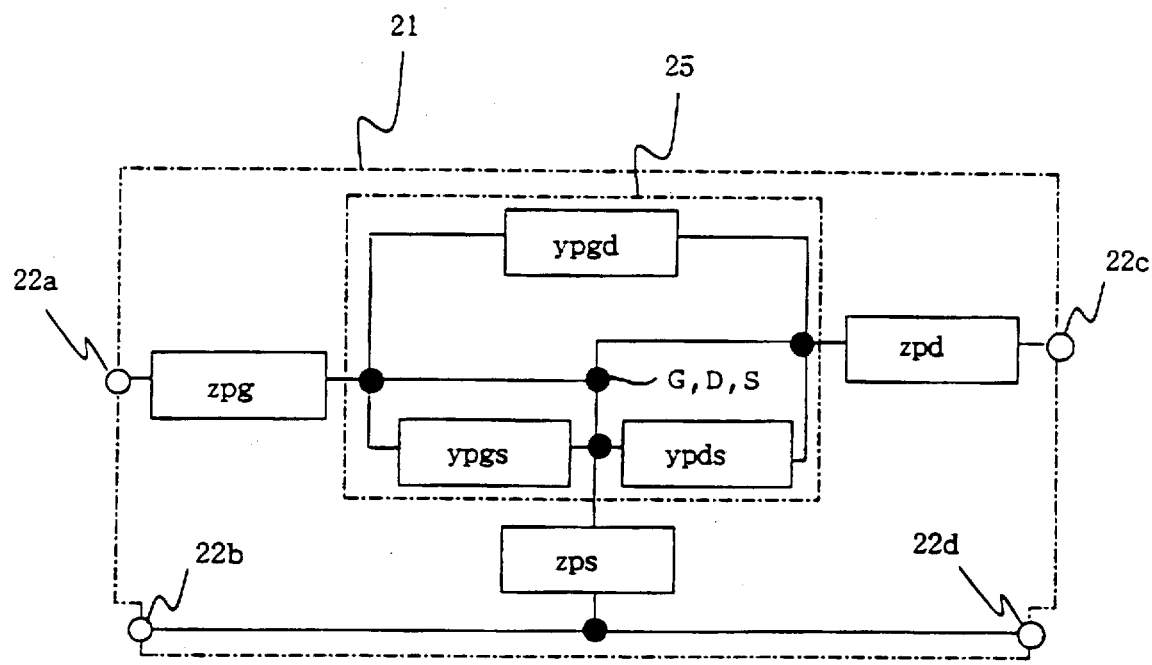
FIG. 12 is a circuit diagram showing an equivalent circuit of a second comparative example mounted on the jig used in the analysis.

A set Zn of z-parameters (zn11, zn12, zn21, zn22) of the equivalent circuit shown in FIG. 12 is expressed by equations 26 to 29.

$$zn11 = zpg + zps \qquad \text{equation 26}$$

$$zn12 = zps \qquad \text{equation 27}$$

$$zn21 = zps \qquad \text{equation 28}$$

$$zn22 = zpd + zps \qquad \text{equation 29}$$

Figure 13:
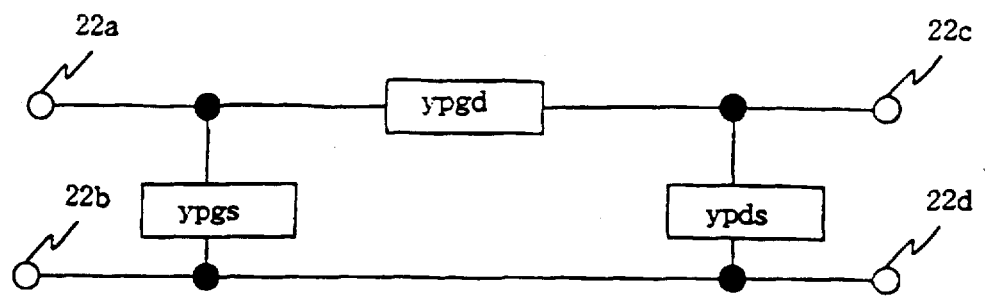
FIG. 13 is a circuit diagram showing a circuit network used in an analysis for the principle of the present invention.

A set Yo of y-parameters (yo11, yo12, yo21, yo22) is given to a circuit network shown in FIG. 13 as follows.

$$yo11 = ypgs \qquad \text{equation 30}$$

$$yo12 = -ypgd \qquad \text{equation 31}$$

$$yo21 = -ypgd \qquad \text{equation 32}$$

$$yo22 = ypds \qquad \text{equation 33}$$

Figure 14:
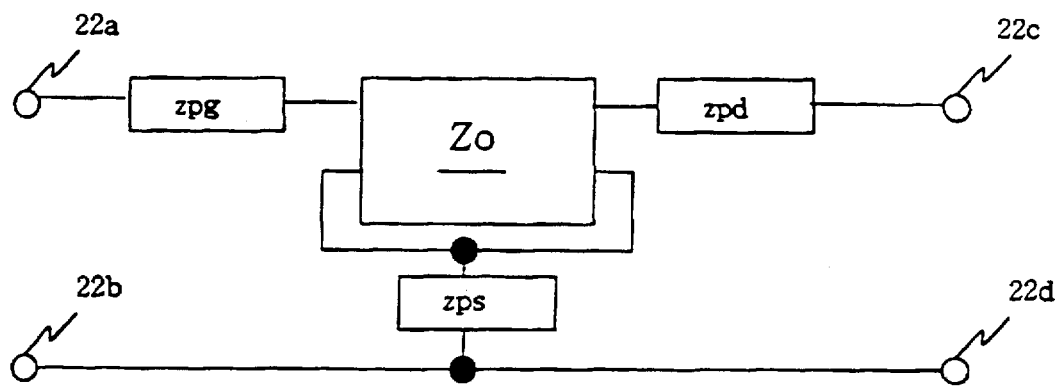
FIG. 14 is a circuit diagram showing another circuit network used in the analysis.

The set Yo of y-parameters is converted to a set of z-parameters (zo11, zo12, zo21, zo22), and Zo stands for the set of z-parameters (zo11, zo12, zo21, zo22). Using the set Zo of z-parameters, we obtain a circuit network shown in FIG. 14, and the circuit network shown in FIG. 14 is equivalent to the equivalent circuit shown in FIG. 11. The circuit network shown in FIG. 14 has a set Zm of z-parameters (zm11, zm12, zm21, zm22), and the z-parameters (zm11, zm12, zm21, zm22) are expressed by equations 34 to 37.

$$zm11 = zpg + zps + zo11 = zn11 + zo11 \qquad \text{equation 34}$$

$$zm12 = zps + zo12 = zn12 + zo12 \qquad \text{equation 35}$$

$$zm21 = zps + zo21 = zn21 + zo21 \qquad \text{equation 36}$$

$$zm22 = zpd + zps + zo22 = zn22 + zo22 \qquad \text{equation 37}$$

Equations 34 to 37 express the following relation.

$$Zm = Zn + Zo \qquad \text{equation 38}$$

Figure 15:
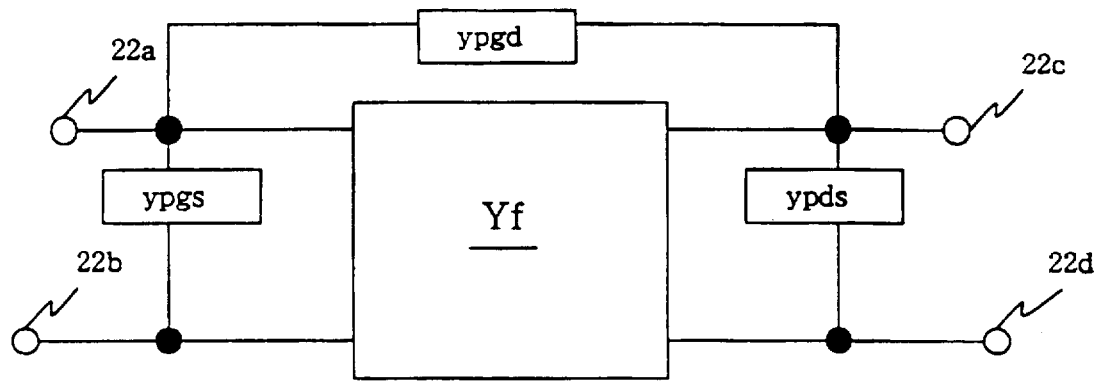
FIG. 15 is a circuit diagram showing yet another circuit network used in the analysis.

Consider a circuit network shown in FIG. 15. The circuit network has a set Yf of y-parameters (yf11, yf12, yf21, yf22), and the y-parameters (yf11, yf12, yf21, yf22) are expressed as follows.

$$yf11 = ypgs + yi11 = yo11 + yi11 \qquad \text{equation 39}$$

$$yf12 = -ypgd + yi12 = yo12 + yi12 \qquad \text{equation 40}$$

$$yf21 = -ypgd + yi21 = yo21 + yi21 \qquad \text{equation 41}$$

$$yf22 = ypds + yi22 = yo22 + yi22 \qquad \text{equation 42}$$

where yi11, yi12, yi21, yi22 are y-parameters of the field effect transistor FET, and Yi stands for the matrix of y-parameters (yi11, yi12, yi21, yi22). Equations 39 to 42 expresses the following relation.

$$Yf = Yo + Yi \quad \text{equation 43.}$$

Zf stands for a set of z-parameters converted from the set Yf of y-parameters.

Figure 16:
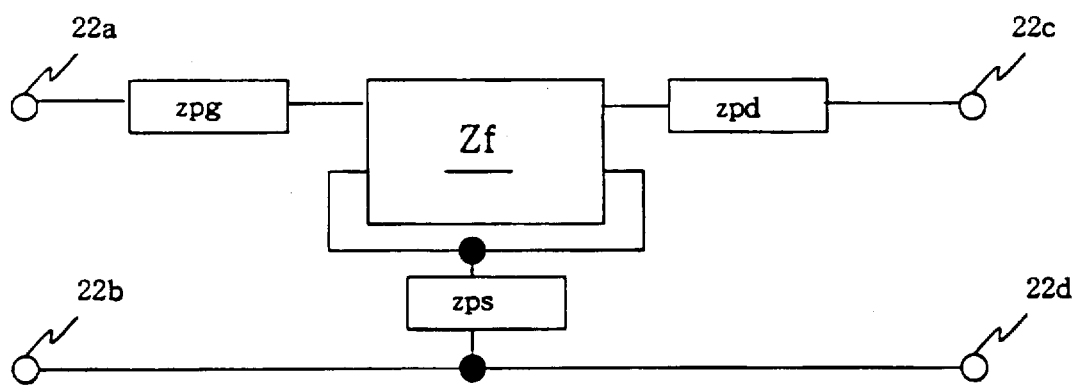
FIG. 16 is a circuit diagram showing still another circuit network used in the analysis.

Considering a circuit network shown in FIG. 16, the circuit network is equivalent to the equivalent circuit shown in FIG. 10, and a set zk of z-parameters (zk11, zk12, zk21, zk22) is given as follows.

$$zk11 = zpg + zps + zf11 = zn11 + zf11 \quad \text{equation 44}$$

$$zk12 = zps + zf12 = zn12 + zf12 \quad \text{equation 45}$$

$$zk21 = zps + zf21 = zn21 + zf21 \quad \text{equation 46}$$

$$zk22 = zpd + zps + zf22 = zn22 + zf22 \quad \text{equation 47}$$

Equations 44 to 47 express the following relation $$Zk = Zn + Zf \quad \text{equation 48}$$

A set of z-parameters is an inverse matrix of a corresponding set of y-parameters, and inv(A) represents an inverse matrix of A.

Equation 48 becomes $$Zk = Zn + Zf$$

$$= Zn + inv(Yf)$$

$$= Zn + inv(Yo + Yi)$$

$$= Zn + inv(iv(Zm - Zn) + Yi) \quad \text{equation 49}$$

Solving equation 49 for Yi, and we obtain equation 50.

$$Yi = inv(Zk - Zn) - inv(Zm - Zn) \quad \text{equation 50}$$

Figure 11:
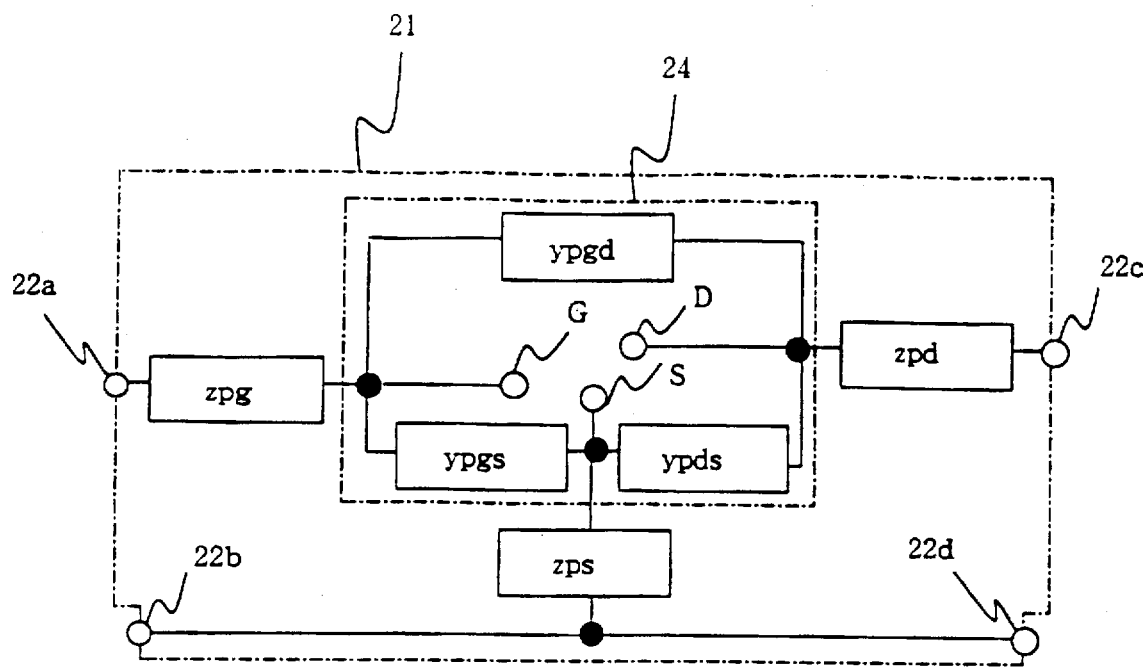
FIG. 11 is a circuit diagram showing an equivalent circuit of a first comparative example mounted on the jig used in an analysis according to the present invention.

When a manufacturer wants to evaluate the field effect transistor FET4, the four terminal parameters are measured for each of the equivalent circuits shown in FIGS. 10, 11 and 12, and are converted to the sets of z-parameters Zk, Zm and Zn. Using equation 50, the manufacturer determines the set Yi of y-parameters for the field effect transistor FET4, and the set Yi of y-parameters are not affected by the parasitic components. The manufacturer may convert the set Yi of y-parameters to the four terminal parameters, and exactly evaluates the field effect transistor FET4 on the basis of the four terminal parameters.

In this instance, the jig serves as a coupling means. When each of the semiconductor device 20, the first comparative sample 24 and the second comparative sample 25 is mounted on a package, the set Yi of y-parameters is obtained as similar to the calculation described hereinbefore.

The four terminal parameters are measured under the same conditions between the semiconductor device 10/20, the first comparative sample 13/24 and the second comparative sample 14/25, and the measured results are free from the frequency dependency. Equations 25 and 50 exactly eliminate undesirable influences of the parasitic components from the set of z-parameters and the set of y-parameters, and make the evaluation reliable. The calculation is only the conversion between the different kinds of parameters, and is simpler than the fitting. For this reason, the evaluation is economical.

DESCRIPTION OF THE PREFERRED EMBODIMENTS

First Embodiment

Figure 17:
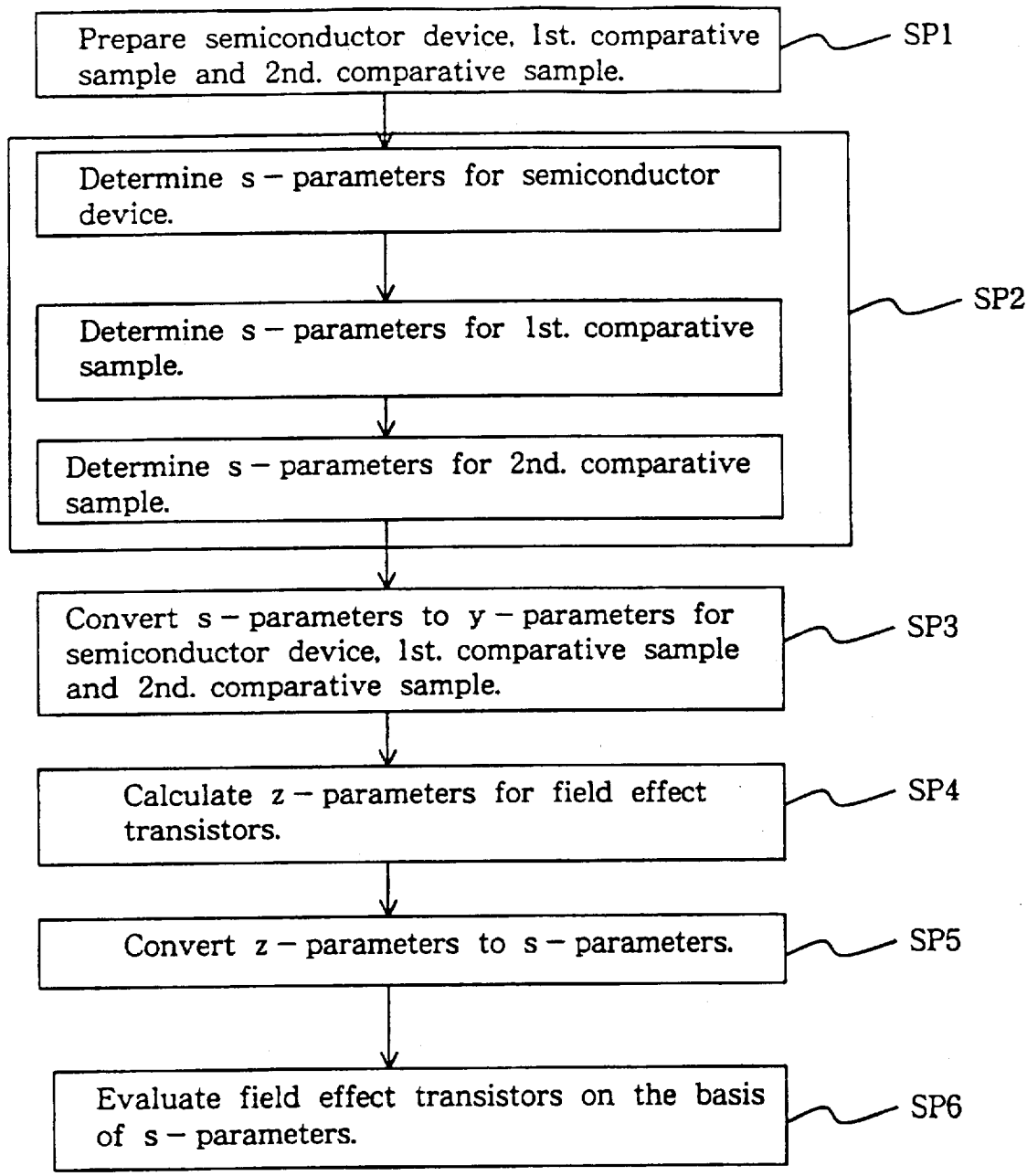
FIG. 17 is a flow chart showing a method of evaluating a semiconductor device according to the present invention.
Figure 18:
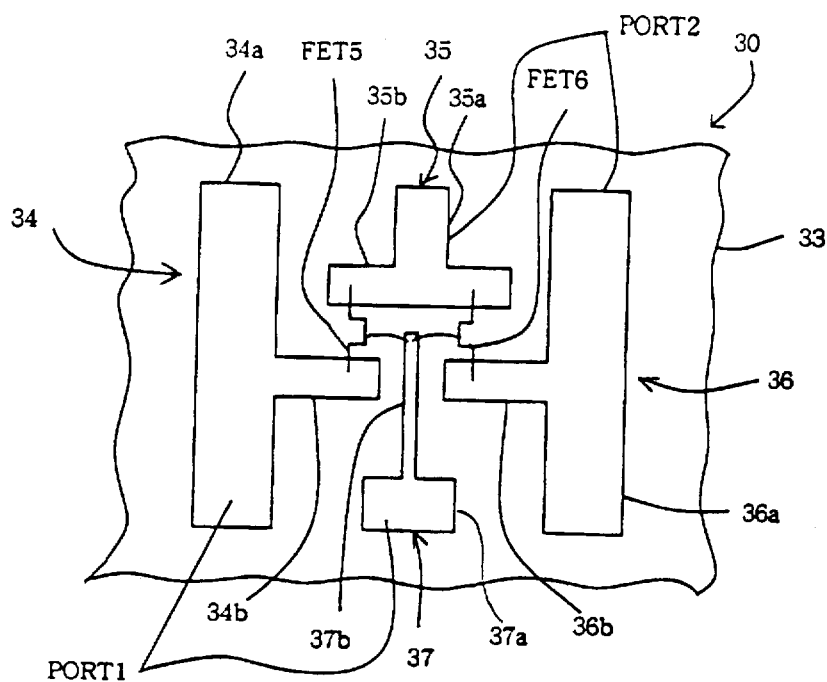
FIG. 18 is a plan view showing a layout of an essential area of a semiconductor device subjected to the evaluation according to the present invention.
Figure 19:
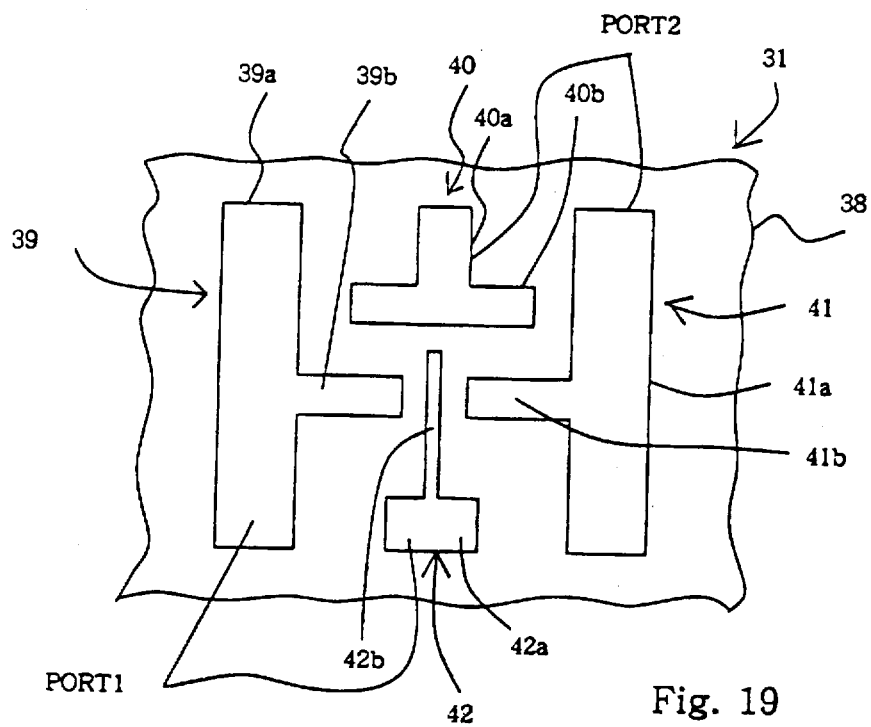
FIG. 19 is a plan view showing a layout of an essential area of a first comparative sample used in the evaluation.
Figure 20:
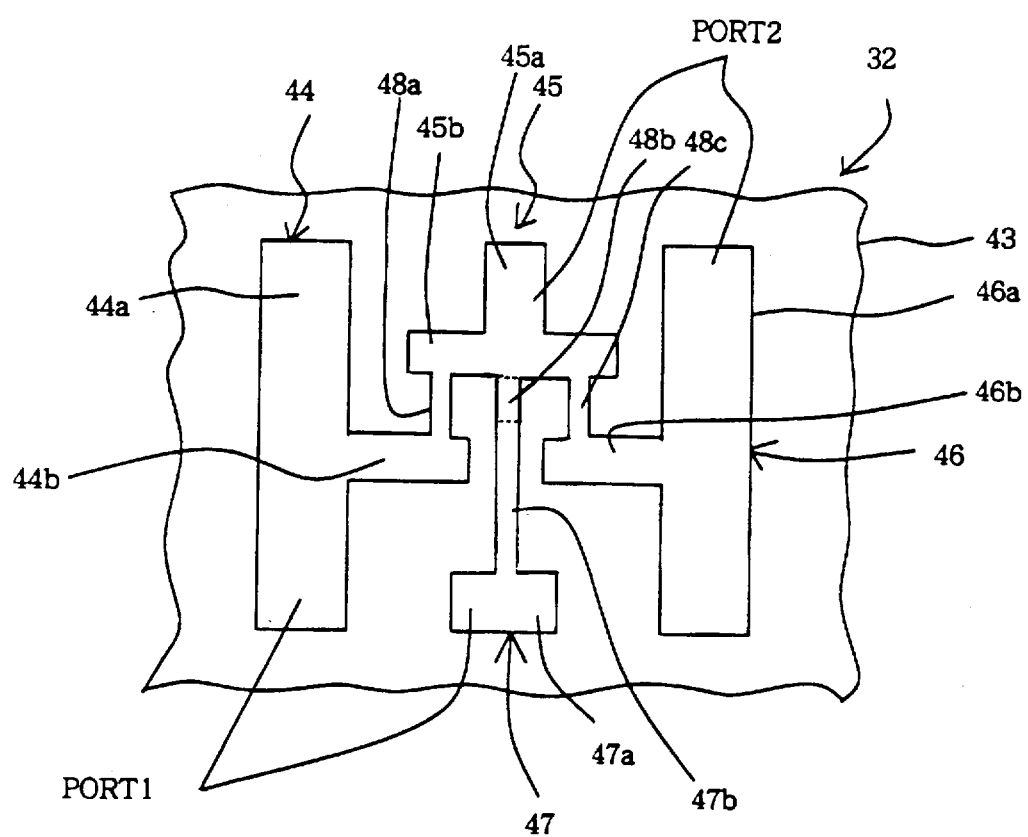
FIG. 20 is a plan view showing a layout of an essential area of a second comparative sample used in the evaluation.

Referring first to FIG. 17 of the drawings, a method of evaluating a semiconductor device implementing the present invention starts with preparation of a semiconductor device 30 as by step SP1, a first comparative sample 31 and a second comparative sample 32, and FIGS. 18, 19 and 20 illustrate the layout of an essential area of the semiconductor device 30, the layout of an essential area of the first comparative sample 31 and the layout of an essential area of the second comparative sample 32, respectively.

Field effect transistors FET5 and FET6 are incorporated in the semiconductor device 30, and are fabricated on a semiconductor substrate 33. Conductive strips 34, 35, 36 and 37 are formed over the semiconductor substrate 33, and provides probing pads 34a, 35a, 36a and 37a and conductive wirings 34b, 35b, 36b and 37b. The conductive wirings 34b, 35b, 36b and 37b are electrically connected to the source node of the field effect transistor FET5, the common drain node of the field effect transistors FET5/FET6, the source node of the field effect transistor FET6 and the common gate electrode of the field effect transistors FET5/FET6, respectively. Although the field effect transistors FET5 and FET6 and the conductive wirings 34b to 37b are covered with an insulating layer, the insulating layer is removed from the layout for the sake of clear discrimination. The probing pads 34a and 37a and the probing pads 35a and 36a form a first port PORT1 and a second port PORT2, respectively, and are connected to a testing apparatus (not shown).

The first comparative sample 31 shown in FIG. 19 is fabricated on a semiconductor substrate 38, and the semiconductor substrate 38 is equivalent to the semiconductor substrate 33. Conductive strips 39, 40, 41 and 42 are formed over the semiconductor substrate 38, and serve as probing pads 39a, 40a, 41a and 42a and conductive wirings 39b, 40b, 41b and 42b. The conductive strips 39 to 42 are electrically equivalent to the conductive wirings 34 to 37, respectively; however, the conductive wirings 39b to 42b are not connected to a field effect transistor. The probing pads 39a and 42a and the probing pads 40a and 41a serve as the first port PORT1 and the second port PORT2, respectively.

The second comparative sample 32 shown in FIG. 20 is fabricated on a semiconductor substrate 43, and the semiconductor substrate 43 is electrically equivalent to the semiconductor substrate 33. Conductive strips 44, 45, 46 and 47 are formed over the semiconductor substrate 43, and serve as probing pads 44a, 45a, 46a, and 47a and conductive wirings 44b, 45b, 46b and 47b. The conductive strips 44 to 47 are electrically equivalent to the conductive strips 34 to 37, respectively. The conductive wirings 44b to 47b are not connected to a field effect transistor, and the conductive wiring 45b is connected through interconnections 48a, 48b and 48c to the conductive wirings 44b, 46b and 47b. The interconnections 48a to 48c are merged with the conductive wirings 44b to 47b, and boundaries are not clearly discriminated. The probing pads 44b and 47b and the probing pads 45b and 46b serve as the first port PORT1 and the second port PORT2, respectively.

Turning to FIG. 17, after the preparation of the semiconductor device 30, the first comparative sample 31 and the second comparative sample 32, the testing apparatus (not shown) is successively connected to the first and second ports PORT1 and PORT2 of the semiconductor device 30, the first comparative sample 31 and the second comparative sample 32. The testing apparatus supplies a testing signal to the semiconductor device 30, the first comparative sample 31 or the second comparative sample 32, and receives an output signal therefrom. The testing signal is varied from 1 GHz to 40 GHz, and the testing apparatus determines three sets of s-parameters for the semiconductor device 30, the first comparative sample 31 and the second comparative sample 32 as by step SP32. The s-parameters serve as the four terminal parameters. Although the s-parameters are successively determined for the semiconductor device 30, the first comparative sample 31 and the second comparative sample 32 in the flow chart shown in FIG. 17, the order is changeable.

Subsequently, the testing apparatus converts the sets of s-parameters to sets of y-parameters for the semiconductor device 30, the first comparative sample 31 and the second comparative sample 32 as by step SP3.

The testing apparatus proceeds to step SP4, and calculates a set Zi of z-parameters for the field effect transistors FET5/FET6 by using equation 51.

$$Zi = inv(Ya - Yb) - inv(Yc - Yb) \qquad \text{equation 51}$$

where Ya is the set of y-parameter for the semiconductor device 30, Yb is the set of y-parameter for the first comparative sample 31 and Yc is the set of y-parameters for the second comparative sample.

The testing apparatus coverts the set Zi of z-parameters to a set of s-parameters as by step SP5, and the manufacturer evaluates the field effect transistors on the basis of the s-parameters as by step SP6.

Thus, the sets of s-parameters are converted to the sets of y-parameters so as to calculate the set of z-parameters for the field effect transistors FET5/FET6, and undesirable influences of parasitic components are eliminated from the set of z-parameters through the calculation. For this reason, the manufacturer exactly evaluate the field effect transistors FET5/FET6, and the evaluation is reliable.

Second Embodiment

Figure 21:
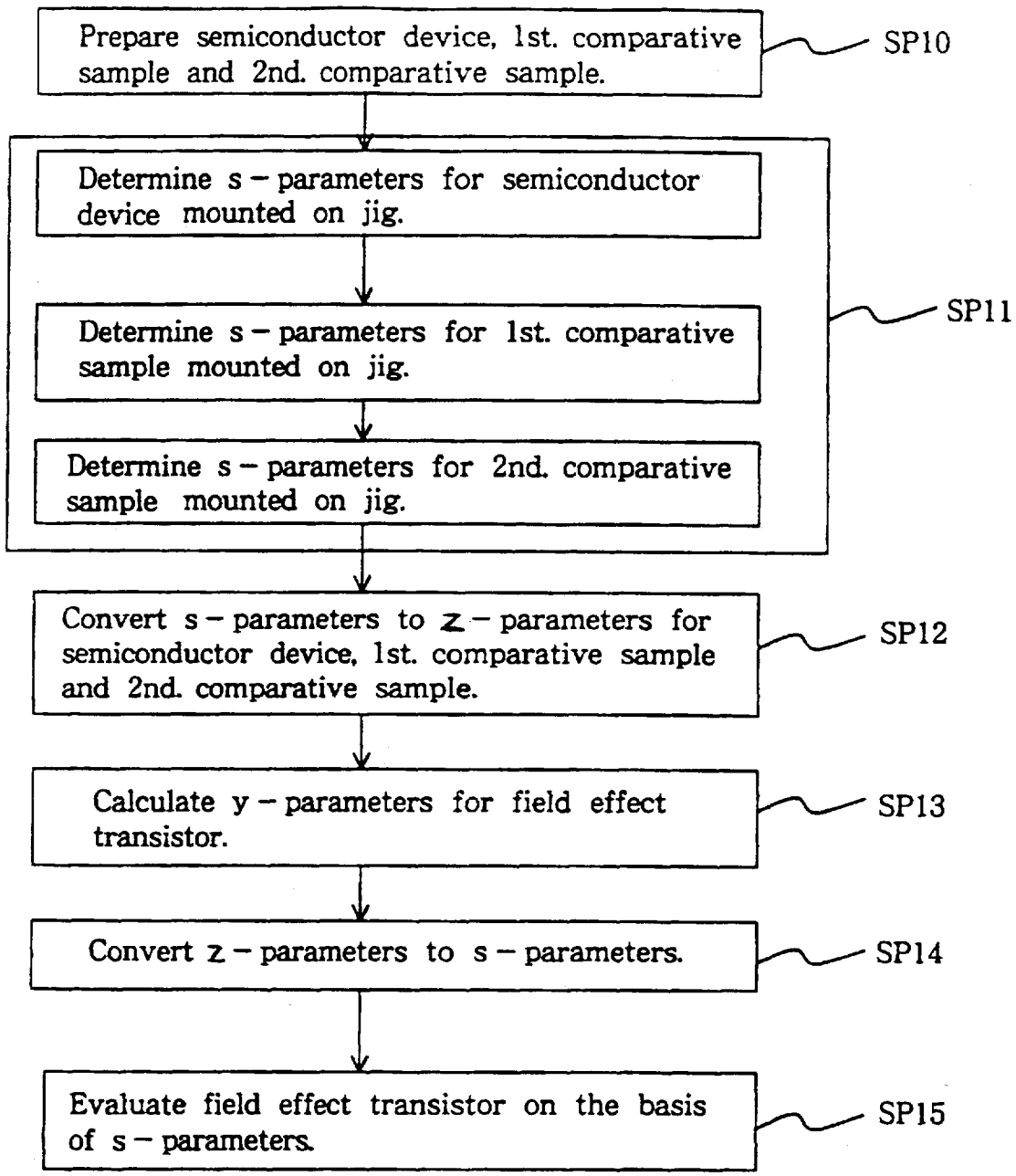
FIG. 21 is a flow chart showing another method of evaluating a semiconductor device according to the present invention.
Figure 22:
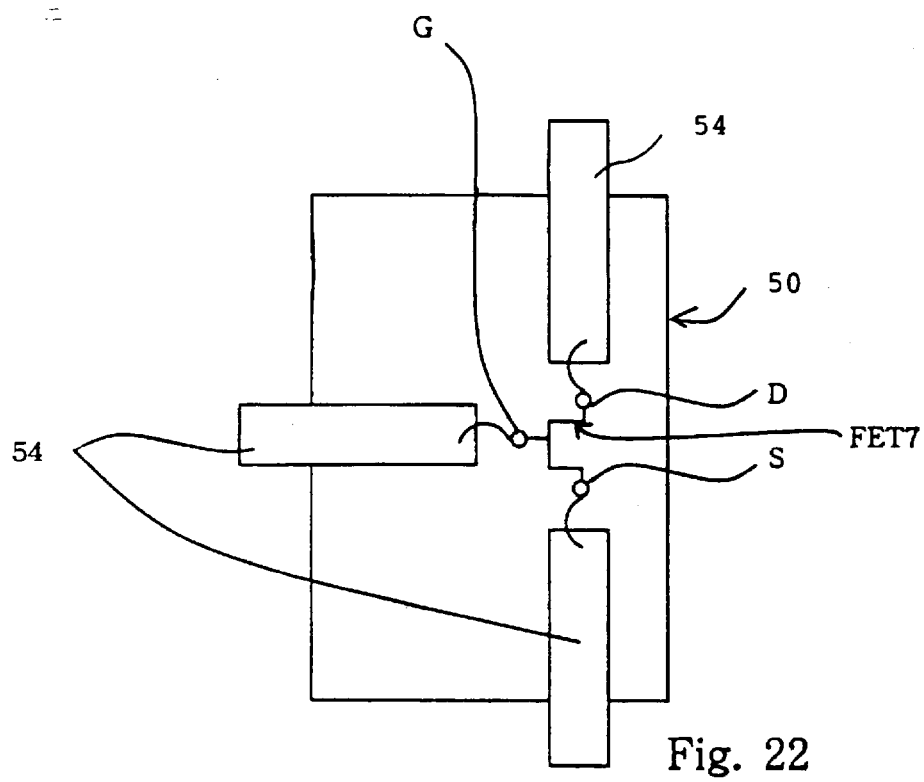
FIG. 22 is a plan view showing a layout of an essential area of a semiconductor device subjected to the evaluation according to the present invention.
Figure 23:
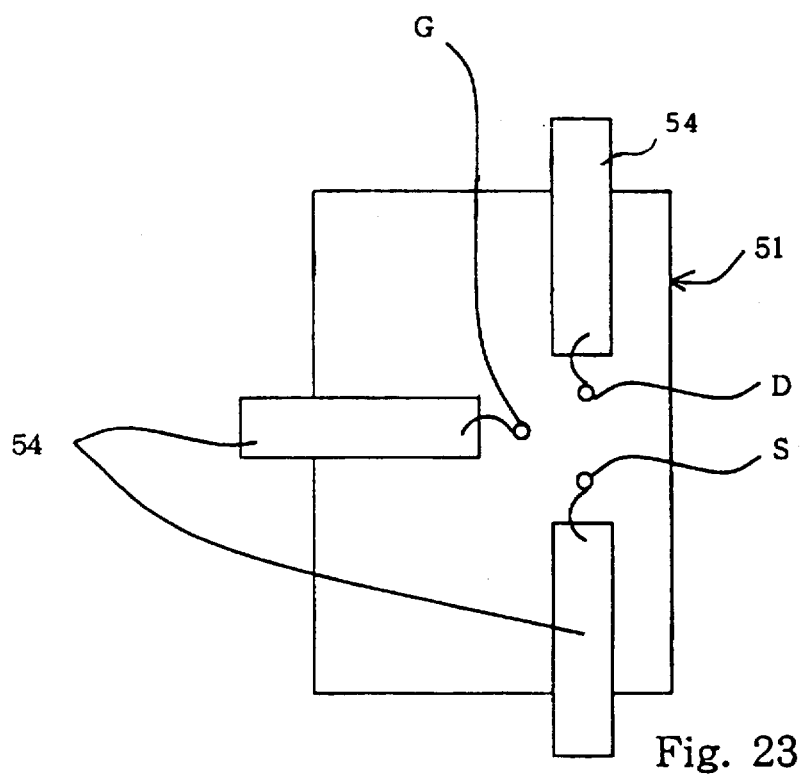
FIG. 23 is a plan view showing a layout of an essential area of a first comparative sample used in the evaluation.
Figure 24:
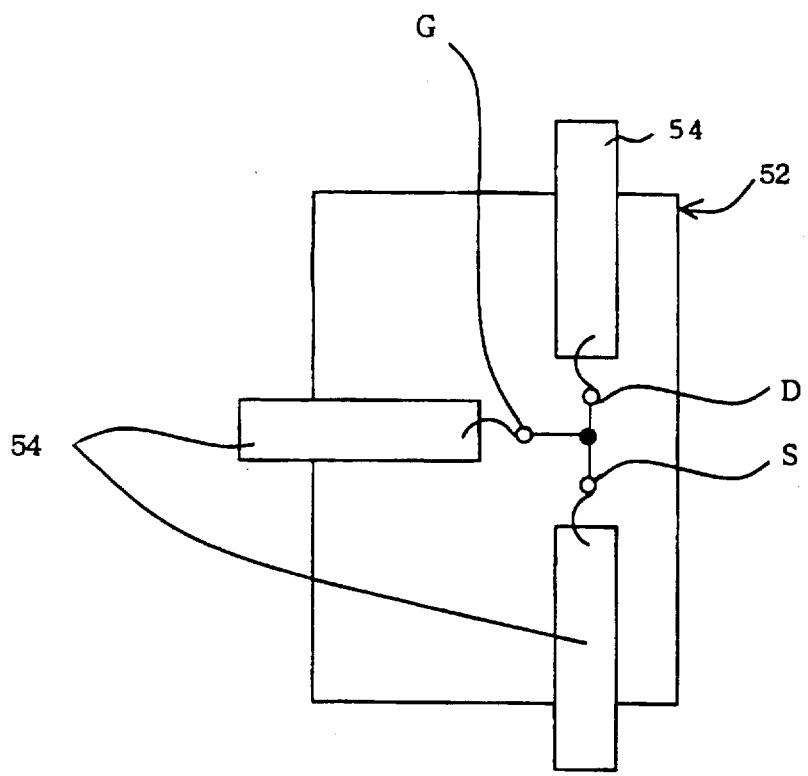
FIG. 24 is a plan view showing a layout of an essential area of a second comparative sample used in the evaluation.

Turning to FIG. 21 of the drawings, a method of evaluating a semiconductor device starts with preparation of a semiconductor device 50 shown in FIG. 22, a first comparative sample 51 shown in FIG. 23 and a second comparative sample 52 shown in FIG. 24 as by step SP10. The semiconductor device 50 includes a field effect transistor FET7, and the field effect transistor FET7 is connected to a gate wiring G, a drain wiring D and a source wiring S. However, the gate wiring G, the drain wiring D and the source wiring S of the first comparative sample 51 are not connected to a field effect transistor, and the wirings G, D and S of the second comparative sample 52 are connected to one another.

Subsequently, the semiconductor device 50, the first comparative sample 51 and the second comparative sample 52 are successively mounted on a jig 54, and the jig is connected to the gate wiring G, the drain wiring D and the source wiring S.

A testing apparatus is connected to the jig, and determines s-parameters for the semiconductor device 50, the first comparative sample 51 and the second comparative sample 52 as by step SP11. The testing signal is changed from 1 GHz to 40 GHz as similar to the first embodiment. Although the flow chart shown in FIG. 21 indicates an order of measurement, the order is changeable.

Subsequently, the testing apparatus converts the sets of s-parameters to sets of z-parameters for the semiconductor device 50, the first comparative sample 51 and the second comparative sample 52 as by step SP12.

The testing apparatus proceeds to step SP13, and calculates a set Yi of y-parameters for the field effect transistor FET7 by using equation 52.

$$Yi = inv(Zk - Zn) - inv(Zm - Zn) \qquad \text{equation 52}$$

where Zk is the set of z-parameter for the semiconductor device 50, Zm is the set of z-parameter for the first comparative sample 51 and Zn is the set of z-parameters for the second comparative sample 52.

The testing apparatus coverts the set Yi of y-parameters to a set of s-parameters as by step SP14, and the manufacturer evaluates the field effect transistors on the basis of the s-parameters as by step SP15.

Thus, the sets of s-parameters are converted to the sets of z-parameters so as to calculate the set of y-parameters for the field effect transistor FET7, and undesirable influences of parasitic components are eliminated from the set of z-parameters through the calculation. For this reason, the manufacturer exactly evaluate the field effect transistor FET7, and the evaluation is reliable.

Although particular embodiments of the present invention have been shown and described, it will be obvious to those skilled in the art that various changes and modifications may be made without departing from the spirit and scope of the present invention.

For example, a bipolar transistor or another circuit component may be subjected to the evaluation according to the present invention.

What is claimed is:

1. A method of evaluating a semiconductor device, comprising the steps of:

a) preparing a semiconductor device having at least one circuit component, a first comparative sample equivalent to said semiconductor device from which said at least one circuit component is deleted and a second comparative sample equivalent to said semiconductor device in which said at least one circuit component is short-circuited;

b) respectively measuring a first set of four terminal parameters, a second set of four terminal parameters and a third set of four terminal parameters for said semiconductor device, said first comparative sample and said second comparative sample connected through a coupling means to a testing apparatus;

c) obtaining a first set of y-parameters or a first set of z-parameters, a second set of y-parameters or a second set of z-parameters and a third set of y-parameters or a third set of z-parameters from said first set of four terminal parameters, said second set of four terminal parameters and said third set of four terminal parameters;

d) calculating a fourth set of y-parameters or a fourth set of z-parameters for said at least one circuit component on the basis of said first to third sets of z-parameters or said first to third sets of y-parameters; and e) determining electric characteristics of said at least one circuit component on the basis of said fourth set of y-parameters or said fourth set of z-parameters.

2. The method as set forth in claim 1, in which said coupling means comprises first pads formed on said semiconductor device and coupled to said at least one circuit component, second pads formed on said first comparative sample and virtually connected to said at least one circuit component deleted therefrom and third pads formed on said second comparative samples and virtually connected to said at least one circuit component short-circuited, and said first to third sets of y-parameters are obtained in said step c) so as to calculate said fourth set of z-parameters in said step d).

3. The method as set forth in claim 2, in which said step d) includes the sub-steps of d-1) calculating a first difference between said first set of y-parameters and said second set of y-parameters and a second difference between said second set of y-parameters and said third set of y-parameters, d-2) converting said first difference and said second difference to a fifth set of z-parameters and a sixth set of z-parameters, and d-3) calculating a third difference between said fifth set of z-parameters and said sixth set of z-parameters so as to obtain said fourth set of z-parameters.

4. The process as set forth in claim 1, in which said coupling means is implemented by a jig where each of said semiconductor device, said first comparative sample and said second comparative sample is mounted, and said first to third sets of z-parameters are obtained in said step c) so as to calculate said fourth set of y-parameters in said step d).

5. The method as set forth in claim 4, in which said step d) includes the sub-steps of d-1) calculating a first difference between said first set of z-parameters and said second set of z-parameters and a second difference between said second set of z-parameters and said third set of z-parameters, d-2) converting said first difference and said second difference to a fifth set of y-parameters and a sixth set of y-parameters, and d-3) calculating a third difference between said fifth set of y-parameters and said sixth set of y-parameters so as to obtain said fourth set of y-parameters.

6. The method as set forth in claim 1, each of the first to third sets of four terminal parameters is a set of s-parameters.

7. A method of evaluating a semiconductor device, comprising the steps of:

a) preparing a semiconductor device having at least one circuit component connected to first probing pads, a first comparative sample having second probing pads and equivalent to said semiconductor device from which said ah leash one circuit component is deleted and a second comparative sample having third probing pads and equivalent to said semiconductor device in which said at least one circuit component is short-circuited;

b) respectively measuring a first set of four terminal parameters, a second set of four terminal parameters and a third set of four terminal parameters for said semiconductor device, said first comparative sample and said second comparative sample by using a testing apparatus connected to said first pads, said second pads and said third pads;

c) obtaining a first set of y-parameters, a second set of y-parameters and a third set of y-parameters from said first set of four terminal parameters, said second set of four terminal parameters and said third set of four terminal parameters;

d) calculating a fourth set of z-parameters for said at least one circuit component on the basis of the following equation $$Zi = inv(Ya-Yb) - inv(Yc-Yb)$$

where Zi is said fourth set of z-parameters, Ya is said first set of y-parameters, Yb is said second set of y-parameters, Yc is said third set of y-parameters and inv is representative of an inverse matrix; and e) determining electric characteristics of said at least one circuit component on the basis of said fourth set of z-parameters.

8. A method of evaluating a semiconductor device, comprising the steps of:

a) preparing a semiconductor device having at least one circuit component connected to, a first comparative sample equivalent to said semiconductor device from which said at least one circuit component is deleted and a second comparative sample equivalent to said semiconductor device in which said at least one circuit component is short-circuited;

b) respectively measuring a first set of four terminal parameters, a second set of four terminal parameters and a third set of four terminal parameters for said semiconductor device, said first comparative sample and said second comparative sample by using a testing apparatus connected to a jig means where said semiconductor device, said first comparative sample and said second comparative sample are mounted;

c) obtaining a first set of z-parameters, a second set of z-parameters and a third set of z-parameters from said first set of four terminal parameters, said second set of four terminal parameters and said third set of four terminal parameters;

d) calculating a fourth set of y-parameters for said at least one circuit component on the basis of the following equation $$Yi = inv(Zk-Zn) - inv(Zm-Zn)$$

where Yi is said fourth set of y-parameters, Zk is said first set of z-parameters, Zm is said second set of z-parameters, zn is said third set of z-parameters and inv is representative of an inverse matrix; and e) determining electric characteristics of said at least one circuit component on the basis of said fourth set of y-parameters.

* * * * *